United States Patent [19]

Patz et al.

[11] 4,281,361
[45] Jul. 28, 1981

[54] SIMPLIFIED MULTILAYER CIRCUIT BOARD

[75] Inventors: Benjamin W. Patz, Orlando; Herbert Berke, Maitland; Donald R. Mendorf, Altamonte Springs, all of Fla.

[73] Assignee: The United States of America as represented by the Secretary of the Navy, Washington, D.C.

[21] Appl. No.: 130,804

[22] Filed: Mar. 17, 1980

[51] Int. Cl.³ ............................................. H05K 1/18
[52] U.S. Cl. .................................. 361/401; 174/68.5; 361/406
[58] Field of Search ......................... 174/68.5, 35 R; 361/401, 406, 413; 339/177

[56] References Cited

U.S. PATENT DOCUMENTS

| | | | |
|---|---|---|---|
| 2,984,834 | 8/1960 | Kalfaian | 174/35 R X |
| 3,219,886 | 11/1965 | Katzin | 361/413 |
| 3,312,870 | 4/1967 | Rhoades | 174/68.5 X |
| 3,340,491 | 9/1967 | Deakin | 361/401 X |
| 3,515,156 | 6/1970 | Steranko | 174/68.5 X |
| 3,593,064 | 7/1971 | Wagner | 361/413 X |
| 3,621,338 | 11/1971 | Rogers | 361/401 X |
| 3,704,455 | 11/1972 | Scarbrough | 174/68.5 X |
| 3,917,983 | 11/1975 | Kuronen | 361/401 X |
| 4,237,522 | 12/1980 | Thompson | 174/68.5 X |

FOREIGN PATENT DOCUMENTS

| | | | |
|---|---|---|---|
| 414761 | 7/1974 | U.S.S.R. | 174/68.5 |
| 445177 | 3/1975 | U.S.S.R. | 174/68.5 |

OTHER PUBLICATIONS

Ardito et al., Making Integral Multilayer Circuit Boards with Cable Connections, IBM Tech. Dis. Bull., V. 14, #3, Aug. 1971, pp. 701 & 702.

Primary Examiner—Richard R. Kucia
Attorney, Agent, or Firm—Richard S. Sciascia; Robert W. Adams; David S. Kalmbaugh

[57] ABSTRACT

A multilayer printed circuit board is disclosed having appropriate ground and voltage planes. The multilayer printed circuit board includes a mounting plane, a plurality of dielectric sheets stacked upon the mounting plane, a plurality of conductive sheets positioned between adjacent dielectric sheets, and a plurality of rectangular shaped apertures passing through the multilayer printed circuit board. Each rectangular shaped aperture of the multilayer printed circuit board has a plurality of voltage connector terminals. Electrical connection from one of the conductive sheets to the appropriate voltage connector terminal is provided by a conductive disc which passes through a hole located within the multilayer printed circuit board.

10 Claims, 3 Drawing Figures

4,281,361

SIMPLIFIED MULTILAYER CIRCUIT BOARD

BACKGROUND OF THE INVENTION

This invention relates generally to printed circuit boards. In particular, this invention relates to a simplified multilayer printed circuit board to be utilized for high speed electronic switching circuits.

DESCRIPTION OF THE PRIOR ART

Multilayer printed circuit boards are well known in the art and have been utilized extensively in computer circuit design, analog circuit design, and the like. Particularly, in computer circuits, the electronic components employed therein require a ground potential, direct current potentials, and alternating current potentials such as clock signals. Thus, multilayer printed circuit boards are ideally suited for supplying the various voltage potentials required by the electronic components utilized in computer circuits.

However, in the operation of a computer circuit, high frequency noise and cross talk are a constant problem in that the electronic components utilized therein develop high noise levels which often exceed the noise level allowable for the computer circuit as designed. This, in turn, leads to false signals appearing at the outputs of some of the components employed in the computer circuit so as to cause the output signals provided by the computer circuit to be incorrect.

As mentioned above, there are many multilayer printed circuit boards available which may be utilized in computer circuit design to significantly reduce the problems of high frequency noise and cross talk. Unfortunately, such devices of the prior art ordinarily leave something to be desired, especially from the standpoints of signal accuracy and complexity in design. Further, such devices of the prior art for manufacturing purposes require special equipment and procedures, thus necessitating a large capital expenditure in equipment to manufacture the aforementioned devices of the prior art.

SUMMARY OF THE INVENTION

The subject invention overcomes some of the disadvantages of the prior art, including those mentioned above, in that it comprises a relatively simple and economical multilayered printed circuit board which may be utilized by electronic components so as to prevent high frequency noise and cross talk when the aforementioned electronic components are operative.

Included in the subject invention is a mounting board having a plurality of rectangular shaped apertures, each aperture of which has a plurality of voltage connector terminals. Stacked upon the mounting board are a plurality of dielectric sheets, each of which has therein a plurality of apertures in alignment with the apertures of the mounting board. Positioned between each adjacent pair of dielectric sheets is a conductive sheet which has therein a plurality of rectangular shaped apertures in alignment with the apertures of the mounting board.

A plurality of conductive discs, which pass through a plurality of holes located within the multilayer printed circuit board, connect the conductive sheets to the voltage connector terminals of the apertures of the mounting board.

DESCRIPTION OF THE PREFERRED EMBODIMENT

Figure 1:
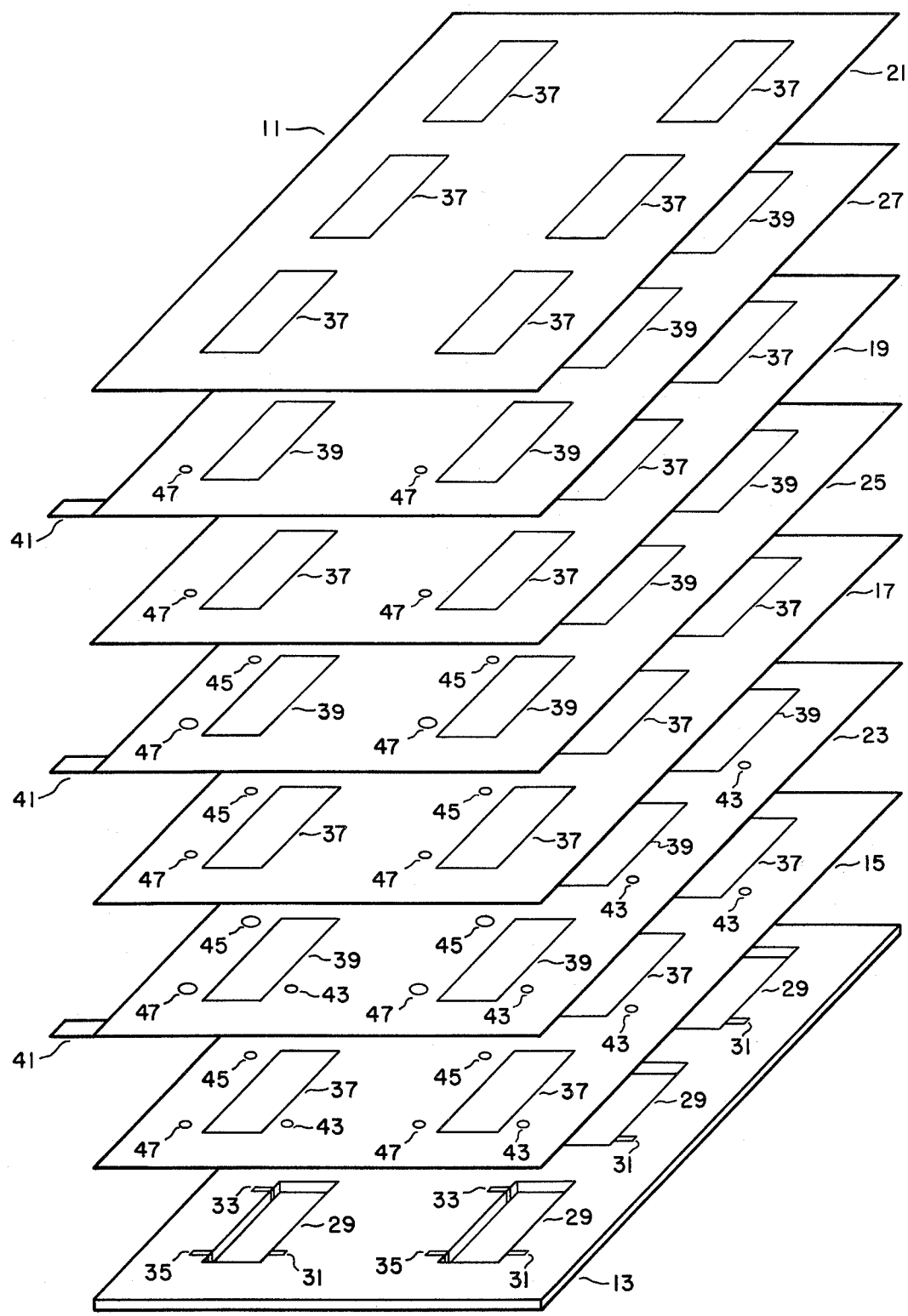
FIG. 1 is an exploded isometric of the sheets which comprise the subject invention.

The preferred embodiment of the subject invention will now be discussed in conjunction with all of the figures of the drawings, wherein like parts are designated by like reference numerals, insofar as it is possible and practical to do so.

Referring now to FIG. 1, there is depicted in an exploded view a multilayer printed circuit board 11 comprising a mounting board 13, a plurality of dielectric sheets 15, 17, 19, and 21, and a plurality of conductive sheets 23, 25, and 27 spatially disposed in a vertical relationship.

Located within mounting board 13 and passing therethrough are a plurality of rectangular shaped apertures 29. Each aperture 29 has attached to the edge thereof a plurality of voltage connector terminals 31, 33, and 35 which extend along the upper surface of mounting board 13.

Located within each of the aforementioned dielectric sheets 15, 17, 19, and 21 and passing therethrough are a plurality of rectangular shaped apertures 37 which are in alignment with rectangular shaped apertures 29 of mounting board 13. Similarly, located within each of the aforementioned conductive sheets 23, 25, and 27 and passing therethrough are a plurality of rectangular shaped apertures 39 which are in alignment with rectangular shaped apertures 29 of mounting board 13.

At this time it may be noteworthy to mention that conductive sheets 23, 25, and 27 may be fabricated from any suitable conductive material such as copper, and that mounting board 13 and dielectric sheets 15, 17, 19, and 21 may be fabricated from any conventional, well known, and commercially available insulative material including, for example, mylar. Also, for the sake of clarity in discussing the preferred embodiment of the subject invention it may be assumed that conductive sheet 23 is a ground plane and that conductive sheets 25 and 27 are voltage planes.

Fixedly attached to the edge of each of the conductive sheets 23, 25, and 27 by means of a spot weld is a connector tab 41. Connector tab 41 of conductive sheet 25 may be utilized to connect conductive sheet 25 to a first voltage source, not shown; connector tab 41 of conductive sheet 27 may be utilized to connect conductive sheet 27 to a second voltage source, not shown; and connector tab 41 of conductive sheet 23 may be utilized to connect the grounds of the aforementioned first and second voltage sources to conductive sheet 23.

Located within and passing through conductive sheet 23 and dielectric sheet 15 are a plurality of holes 43, each of which is in alignment with one of the voltage connector terminals 31 of mounting board 13. Located within and passing through conductive sheets 23 and 25 and dielectric sheets 15 and 17 are a plurality of holes 45, each of which is in alignment with one of the voltage connector terminals 33 of mounting board 13. Located within and passing through conductive sheets 23, 25, and 27 and dielectric sheets 15, 17, and 19 are a plurality of holes 47, each of which is in alignment with one of the voltage connector terminals 35 of mounting board 13.

Figure 2:
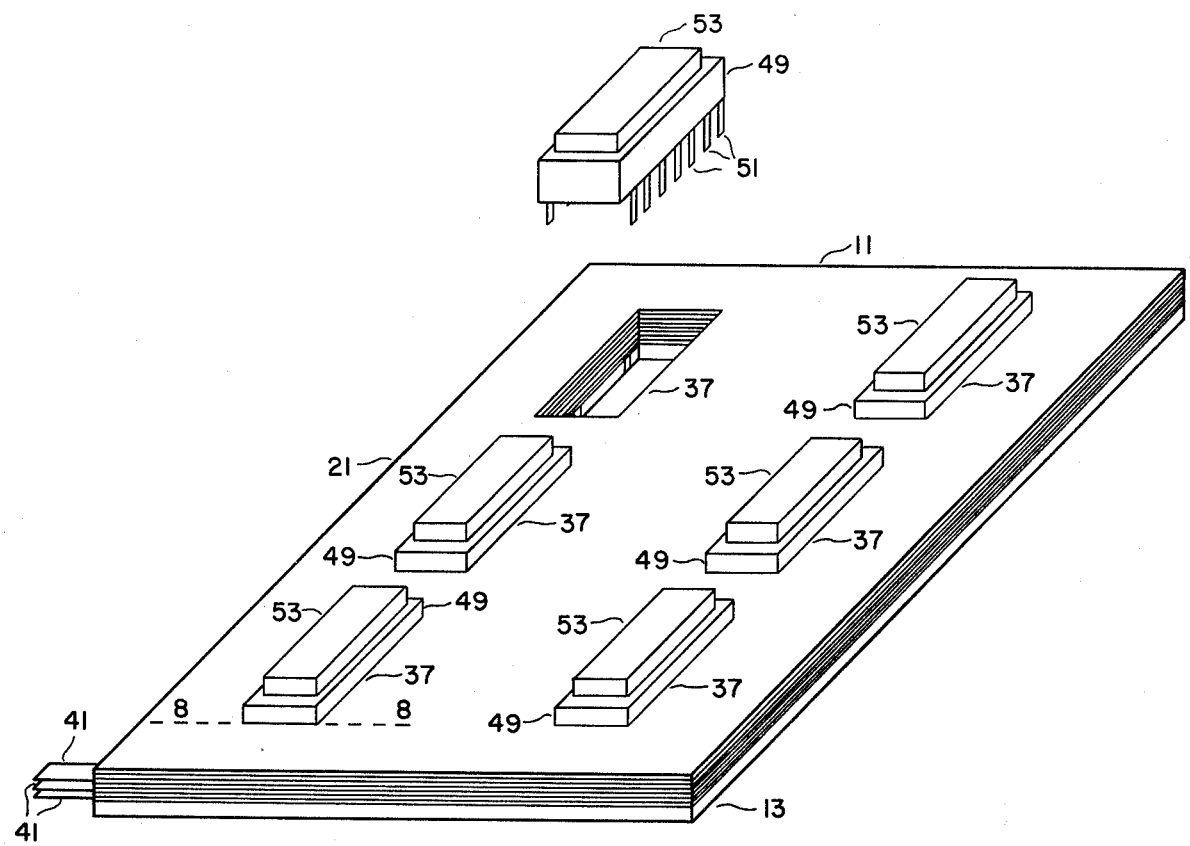
FIG. 2 is an isometric of the invention of FIG. 1.

Referring now to FIG. 2, there is shown an isometric view of multilayer printed circuit board 11. Inserted within each aperture 37 of dielectric sheet 21 of multilayer printed circuit board 11 is a dual inline socket 49, which has protruding from the bottom surface thereof a plurality of connector pins 51. Each dual inline socket 49 functions as a mounting socket for an integrated circuit package 53, which has located therein a plurality of electronic components.

At this time it may be noteworthy to mention that each dual inline socket 49 may be an eight pin socket, a fourteen pin socket, a sixteen pin socket, a twenty pin socket, or a twenty-four pin socket, depending upon the number of pins, not shown, protruding from the particular integrated circuit package 53 mounted therein. Further, it should be noted that the integrated circuit chips, not shown, located within each integrated circuit package 53 may require more than two potentials and a ground to be operative. This, in turn, may require that multilayer printed circuit board 11 be configured to include more than three conductive sheets and more than three voltage connector terminals.

Figure 3:
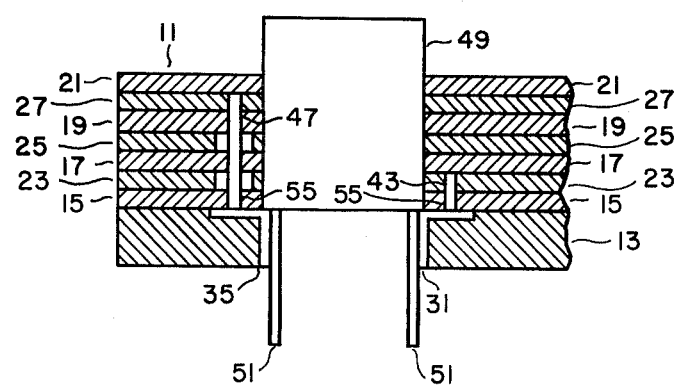
FIG. 3 is a cross-sectional view taken along line 8—8 of FIG. 2.

Referring now to FIG. 3, there is shown a partial cross-sectional view of multilayer printed circuit board 11 taken along line 8—8. The first, second, and third of the plurality of connector pins 51 protruding from dual inline socket 49 are respectively connected to voltage connector terminals 31, 33, FIG. 1, and 35 by means of spot welds or any other suitable, conventional connecting means.

The first of a plurality of conductive discs 55 is inserted in aperture 43 of multilayer printed circuit board 11 so as to connect voltage connector terminal 31 to conductive sheet 23 and thus provide the ground plane for integrated circuit package 53, FIG. 2.

The second of the plurality of conductive discs 55 is inserted in aperture 47 of multilayer printed circuit board 11 so as to connect voltage connector terminal 35 to conductive sheet 27 and thus provide the first of the pair of voltage planes for integrated circuit package 53, FIG. 2. It should be noted that the part of aperture 47 located within conductive sheets 23 and 25 is made larger than the remainder of aperture 47 so as to avoid the possibility of undesired short circuits to conductive sheets 23 and 25.

The third of the plurality of conductive discs 55 is inserted in aperture 45, FIG. 1, of multilayer printed circuit board 11 so as to connect voltage connector terminal 33, FIG. 1, to conductive sheet 25 and thus provide the second of the pair of voltage planes for integrated circuit package 53, FIG. 2. It should be noted that the part of aperture 45, FIG. 1, located within conductive sheet 23 is made larger than the remainder of aperture 45, FIG. 1, so as to avoid the possibility of undesired short circuits to conductive sheet 23.

At this time it should be mentioned that one end of each of the conductive discs 55 is connected to the appropriate voltage connector terminal by means of spot weld with the opposite end thereof connected to the appropriate conductive sheet by means of a spot weld. Further, it should be noted that conventional wire wrapping or soldering connections may be utilized to connect the connector pins 51 of dual inline socket 49 through which digital or analog signals are passed.

In addition, it may be noteworthy to mention at this time that the diameter of each conductive disc 55 should be approximately 0.100 inches, conductive sheets 23, 25, and 27 should be approximately 0.300 inches thick, and dielectric sheets 15, 17, 19, and 21 should be approximately 0.010 inches thick. This, in turn, results in a characteristic impedance of less than two ohms for multilayer printed circuit board 11, thereby reducing the high frequency noise and cross talk between the electronic components within each integrated circuit package 53 of multilayer printed circuit board 11.

From the foregoing, it may readily be seen that the subject invention comprises a new, unique, and exceedingly useful multilayer printed circuit board which constitutes a considerable improvement over the known prior art. Obviously, many modifications and variations of the present invention are possible in light of the above teachings. It is, therefore, to be understood that within the scope of the appended claims the invention may be practiced otherwise than as specifically described.

What is claimed is:

1. A multilayer circuit board comprising, in combination:
   a mounting board having a plurality of rectangular shaped apertures therein, each aperture of which has a plurality of voltage connector terminals attached to the edge thereof, said voltage connector terminals extending along the upper surface of said mounting board;
   a plurality of dielectric sheets stacked upon the upper surface of said mounting board, each of which has therein a plurality of rectangular shaped apertures in alignment with the rectangular shaped apertures of said mounting board;
   a plurality of conductive sheets, each of which is positioned between a pair of adjacent dielectric sheets and each of which has located therein a plurality of rectangular shaped apertures in alignment with the rectangular shaped apertures of said mounting board;
   a plurality of holes extending from the upper surface of said mounting board to individual conductive sheets at each appropriate connection point thereof, said plurality of holes being in alignment with the voltage connector terminals of the rectangular shaped apertures of said mounting board; and
   a plurality of conductive discs, each of which is inserted into one of said plurality of holes so as to connect the voltage connector terminals of the rectangular shaped apertures of said mounting board to the appropriate connection points of each of said plurality of conductive sheets.

2. The multilayer circuit board according to claim 1, wherein one of said plurality of conductive sheets forms a ground plane and the remainder of said plurality of conductive sheets form voltage planes.

3. The multilayer circuit board according to claim 1, further characterized by a plurality of dual inline sockets, each of which is inserted into one of the rectangular shaped apertures of said mounting board.

4. The multilayer circuit board according to claim 1, further characterized by a plurality of tab connections, each of which is connected to the edge of one of said plurality of conductive sheets.

5. A simplified multilayer printed circuit board comprising in combination:
   a mounting board having a plurality of rectangular shaped apertures, each aperture of which has first, second, and third voltage connector terminals attached to the edge thereof, said first, second, and third voltage connector terminals extending along the upper surface of said mounting board;

a first dielectric sheet mounted upon the upper surface of said mounting board and secured thereto, said first dielectric sheet having a plurality of rectangular shaped apertures in alignment with the apertures of said mounting board, each aperture having located near the edge thereof first, second, and third holes respectively in alignment with the first, second, and third voltage connector terminals of one of the apertures of said mounting board;

a first conductive sheet mounted upon the upper surface of said first dielectric sheet and secured thereto, said first conductive sheet having a plurality of rectangular shaped apertures in alignment with the apertures of said first dielectric sheet, each aperture of said first conductive sheet having located near the edge thereof first, second, and third holes respectively in alignment with the first, second, and third voltage connector terminals of one of the apertures of said mounting board;

a second dielectric sheet mounted upon the upper surface of said first conductive sheet and secured thereto, said second dielectric sheet having a plurality of rectangular shaped apertures in alignment with the apertures of said first conductive sheet, each aperture of said second dielectric sheet having located near the edge thereof first and second holes respectively in alignment with the first and second voltage connector terminals of one of the apertures of said mounting board;

a second conductive sheet mounted upon the upper surface of said second dielectric sheet and secured thereto, said second conductive sheet having a plurality of rectangular shaped apertures in alignment with the apertures of said second dielectric sheet, each aperture of said second conductive sheet having located near the edge thereof first and second holes respectively in alignment with the first and second voltage connector terminals of one of the apertures of said mounting board;

a third dielectric sheet mounted upon the upper surface of said second conductive sheet and secured thereto, said third dielectric sheet having a plurality of rectangular shaped apertures in alignment with the apertures of said second conductive sheet, each aperture of said third dielectric sheet having located near the edge thereof a hole in alignment with the first voltage connector terminal of one of the apertures of said mounting board;

a third conductive sheet mounted upon the upper surface of said third dielectric sheet, said third conductive sheet having a plurality of rectangular shaped apertures in alignment with the apertures of said third dielectric sheet, each aperture of said third conductive sheet having located near the edge thereof a hole in alignment with the first voltage connector terminal of said mounting board;

a fourth dielectric sheet mounted upon the upper surface of said third dielectric sheet and secured thereto, said fourth dielectric sheet having a plurality of rectangular shaped apertures in alignment with the apertures of said third conductive sheet; and a plurality of conductive discs, a third of said conductive discs having one end thereof inserted within the holes of said third conductive plane and connected thereto, with the opposite ends thereof connected to the first voltage connector terminals of the apertures of said mounting board, a third of said conductive discs having one end thereof inserted within the second holes of said second conductive plane and connected thereto, with the opposite ends thereof connected to the second voltage connector terminals of the apertures of said mounting board, and a third of said conductive discs having one end thereof inserted within the third holes of said first conductive plane and connected thereto, with the opposite ends thereof connected to the third voltage connector terminal of the apertures of said mounting board.

6. The simplified multilayer printed circuit board of claim 5, in which said mounting board and said first, second, third, and fourth dielectric sheets are fabricated from mylar.

7. The simplified multilayer printed circuit board of claim 5, in which said first, second, and third conductive sheets are fabricated from copper.

8. The simplified multilayer printed circuit board of claim 5, in which said conductive discs are fabricated from copper.

9. The simplified multilayer printed circuit board of claim 5, further characterized by a plurality of dual inline sockets, each of which has a plurality of connector pins and each of which is inserted into one of the rectangular shaped apertures of said mounting board such that three of the plurality of connector pins of said dual inline socket make contact with the first, second, and third voltage connector terminals of one of the apertures of said mounting board.

10. The simplified multilayer printed circuit board of claim 5, further characterized by a trio of tab connectors, the first of which is connected to the edge of said first conductive sheet, the second of which is connected to the edge of said second conductive sheet, and the third of which is connected to the edge of said third conductive sheet.

* * * * *